United States Patent
Ding et al.

(10) Patent No.: US 8,865,008 B2
(45) Date of Patent: Oct. 21, 2014

(54) TWO STEP METHOD TO FABRICATE SMALL DIMENSION DEVICES FOR MAGNETIC RECORDING APPLICATIONS

(71) Applicant: Headway Technologies, Inc., Milpitas, CA (US)

(72) Inventors: Ruhang Ding, Pleasanton, CA (US); Hui-Chuan Wang, Pleasanton, CA (US); Minghui Yu, Fremont, CA (US); Jianing Zhou, Fremont, CA (US); Min Li, Fremont, CA (US); Cherng Chyi Han, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 69 days.

(21) Appl. No.: 13/660,183

(22) Filed: Oct. 25, 2012

(65) Prior Publication Data

US 2014/0116984 A1    May 1, 2014

(51) Int. Cl.
*B44C 1/22* (2006.01)
*H01J 37/08* (2006.01)
*G11B 5/31* (2006.01)

(52) U.S. Cl.
CPC .............. *G11B 5/3116* (2013.01); *H01J 37/08* (2013.01)
USPC .......................................................... 216/22

(58) Field of Classification Search
CPC ........ B82Y 25/00; B82Y 10/00; B82Y 40/00; G01R 33/098; G11B 5/3163; G11B 5/398; G11B 5/3116; G11B 5/3932; G11B 5/1871; H01L 43/12; H01L 21/0332; H01F 41/308; H01J 2237/3146; H01J 2237/3151
USPC ..................... 216/22; 360/125.31, 313, 324.1
See application file for complete search history.

(56) References Cited

U.S. PATENT DOCUMENTS

| | | | |
|---|---|---|---|
| 7,708,543 B2 | 5/2010 | Shirotori et al. | |
| 7,784,170 B2 | 8/2010 | Kagami et al. | |
| 7,881,022 B2 | 2/2011 | Takei et al. | |
| 8,305,711 B2 | 11/2012 | Li et al. | |
| 2006/0103988 A1* | 5/2006 | Lin et al. | 360/324.1 |
| 2008/0218910 A1* | 9/2008 | Kojima et al. | 360/319 |
| 2011/0198314 A1* | 8/2011 | Wang et al. | 216/22 |

* cited by examiner

*Primary Examiner* — Duy Deo
*Assistant Examiner* — Erin Bergner
(74) *Attorney, Agent, or Firm* — Saile Ackerman LLC; Stephen B. Ackerman

(57) ABSTRACT

A two part ion beam etch sequence involving low energy (<300 eV) is disclosed for fabricating a free layer width (FLW) as small as 20-25 nm in a MTJ element. A first etch process has one or more low incident angles and accounts for removal of 70% to 100% of the MTJ stack that is not covered by an overlying photoresist layer. The second etch process employs one or more high incident angles and a sweeping motion that is repeated during a plurality of cycles. Sidewall slope may be adjusted by varying the incident angle during either of the etch processes. FLW is about 30 nm less than an initial critical dimension in the photoresist layer while maintaining a MR ratio over 60% and low RA (resistance×area) value of 1.0 ohm-µm².

20 Claims, 5 Drawing Sheets

TWO STEP METHOD TO FABRICATE SMALL DIMENSION DEVICES FOR MAGNETIC RECORDING APPLICATIONS

RELATED PATENT APPLICATION

This application is related to the following: Ser. No. 12/658,662, filing date Feb. 12, 2010; which is assigned to a common assignee and is herein incorporated by reference in its entirety.

TECHNICAL FIELD

The present disclosure relates to a method of reducing the critical dimension (CD) of a magnetoresistive sensor, and in particular, to a two part ion beam etch (IBE) sequence for the fabrication of a giant magnetoresistive (GMR) element or a tunneling magnetoresistive (TMR) element that has a free layer width as low as 20 nm while maintaining a high magnetoresistive ratio (dR/R) and other magnetic properties.

BACKGROUND

A magnetic tunnel junction (MTJ) element also referred to as a sensor is a key component of magnetic recording devices. There is a continuous push to increase recording density which requires the sensor to become smaller in order to meet high performance demands of new devices. There are several ways to generate sensors with a smaller CD. One is to reduce the CD by shrinking the mask dimension in the pattern that is printed by a photolithography method into a photoresist mask layer that is coated on a top surface of a MTJ stack. Subsequently, the mask pattern is transferred through the MTJ stack of layers with an etch process to produce a plurality of MTJ elements with a CD similar to that in the photoresist pattern. A second method is to pattern a photoresist mask layer through a photolithography process, and then use a reactive ion etch (RIE) to reduce the photoresist dimension and thereby shrink the dimension (CD) of the sensor that is formed in a subsequent etch process. However, both of these methods have practical limits and cannot reproducibly generate a CD less than about 30 nm which is needed in high performance recording devices.

A MTJ element may be based on a TMR effect wherein a stack of layers has a configuration in which two ferromagnetic layers are separated by a thin non-magnetic dielectric layer. In a GMR sensor, the non-magnetic spacer is typically Cu or another non-magnetic metallic layer. In a sensor, the MTJ element is formed between two shields. A MTJ stack of layers that is subsequently patterned to produce a MTJ element may be formed in a so-called bottom spin valve configuration by sequentially depositing a seed layer, an optional anti-ferromagnetic (AFM) pinning layer, a ferromagnetic "pinned" layer or reference layer, a thin tunnel barrier layer, a ferromagnetic "free" layer, and a capping layer on a substrate. The AFM layer holds the magnetic moment of the pinned layer in a fixed direction. The free layer has a magnetization that is able to rotate from a direction parallel to that of the pinned layer to a direction anti-parallel to the pinned or reference layer and thereby establish two different magnetic states. Alternatively, the MTJ element may have a top spin valve configuration wherein a free layer is formed on a seed layer followed by sequentially forming a tunnel barrier layer, a pinned or reference layer, optional AFM layer, and a capping layer.

Current technology does not enable a solution for achieving a high performance sensor CD or free layer width (FLW) of about 20-25 nm in a reliable manner. Therefore, a new method for fabricating a magnetoresistive sensor is required in order to enable further advances in magnetic recording devices.

SUMMARY

One objective of the present disclosure is to provide a method for shrinking a sensor CD, and in particular, reducing free layer width (FLW) to a range of 20 to 25 nm.

A second objective of the present disclosure is to provide a method for shrinking FLW according to the first objective while maintaining a high magnetoresistive ratio and other magnetic properties of the sensor.

A third objective of the present disclosure is to provide a method for shrinking a sensor CD that also enables the junction slope to be easily manipulated.

According to a preferred embodiment, these objectives are achieved by initially depositing a MTJ stack of layers on a substrate such as a first shield in a read head. The MTJ stack of layers may have a bottom spin valve, top spin valve, or dual spin valve configuration with a capping layer as the uppermost layer in the stack. A first photoresist layer is coated on the capping layer and patterned with a conventional process to form a parallel line pattern from a top view. The plurality of parallel lines in the photoresist mask layer is then transferred through the MTJ stack by an IBE process to generate a MTJ element having two sidewalls and a FLW along a plane that will become the air bearing surface (ABS) in the final recording device.

A key feature of the present disclosure is a two part IBE sequence hereafter referred to as the "etch sequence" that produces a FLW with a substantially smaller width than previously realized while maintaining MR ratio and other magnetic properties in the MTJ element. In one embodiment, the MTJ stack of layers has a TMR configuration wherein a non-magnetic spacer made of a dielectric material is formed between a pinned layer and a free layer. Alternatively, the MTJ stack may have a GMR configuration with a non-magnetic metal layer formed between the free layer and pinned layer.

The first process in the two part etch sequence comprises a low incident angle etch treatment of less than 40 degrees with respect to a plane perpendicular to the planes of the MTJ stack of layers. The inert gas ions comprised of Ar or the like have a low energy (<300 eV) and etch the free layer to a first width (FLW) that represents removal of about 70% to 100% of the total MTJ volume to be etched during the entire etch sequence. The wafer is rotated in a constant direction during the first etch process that may include a plurality of steps with different low incident angles. Thereafter, a second etch process that includes at least two steps is performed with low energy (<300 eV) and a high incident angle of greater than 60 degrees from the perpendicular plane in a sweeping motion. During a first step, the rotation of the wafer is reversed repeatedly over an arc up to about 90 degrees so that the ion beam sweeps back and forth a plurality of times over a first sidewall of the MTJ element. Thereafter, a second step is applied wherein the procedure of the first step is repeated along the second sidewall of the MTJ element wherein the second sidewall is on an opposite side of the MTJ with respect to the first sidewall. As a result, the FLW is trimmed to a second width and the first and second sidewalls may be further adjusted to a more vertical profile (junction slope). Furthermore, each of the steps in the second etch process may comprise a plurality of different high incident angles. By using the new two part etch sequence, a FLW as small as 20 nm may be achieved when starting with a photoresist mask layer CD of 50 nm. In other words, the etch sequence disclosed herein is capable of forming a FLW that is 30 nm smaller than the CD of the overlying photoresist mask layer.

Thereafter, a hard bias or shielding layer for providing longitudinal bias to the free layer is typically formed proximate to the sidewalls of the MTJ element. The first photoresist layer is then removed and a second photoresist layer is coated over the line pattern. Conventional processing is employed to pattern the second photoresist layer to form a line pattern that runs essentially perpendicular to the lines from the earlier etch sequence. Then, the second photoresist pattern is used as a mask while a third etch process removes portions of the MTJ line pattern and forms a plurality of island shapes that may be rectangular, elliptical, or circular, for example, and formed in arrays of rows and columns. Thus, the first and second sidewalls resulting from the etch sequence of the present disclosure become part of a continuous sidewall around the plurality of MTJ elements. Preferably, the CD or FLW from the etch sequence is retained along a plane that is parallel to the ABS following the third etch process that forms a continuous MTJ sidewall. Once the second photoresist layer is removed, an insulation layer is typically deposited adjacent to MTJ sidewalls that are formed as a result of the third etch process. Leads are formed that make electrical contact with the top surfaces of the plurality of MTJ elements and a second shield layer is deposited above the plurality of MTJ elements.

DETAILED DESCRIPTION

Figure 1:
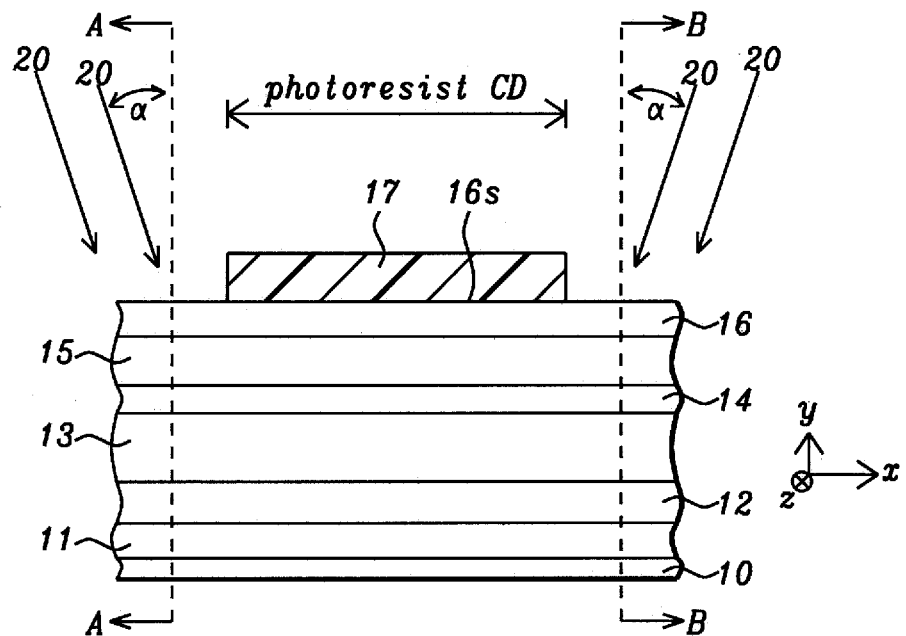
FIG. 1 is a cross-sectional view of a MTJ stack of layers on which a photoresist pattern has been formed, and shows ions with low incident angle during a first etch process that remove 70% to 100% of the MTJ volume to be etched during the etch sequence of the present disclosure.

The present disclosure is a method of fabricating a free layer width (FLW) in a MTJ element (magnetoresistive sensor) that is up to 30 nm less than a CD in an overlying photoresist mask layer pattern that is transferred through a MTJ stack with an IBE etch sequence. A FLW as low as 20 to 25 nm is achieved while maintaining the magnetic properties of the sensor. In a most general embodiment, the etch sequence described herein applies to any MTJ stack of layers that includes at least a reference layer, free layer, and a non-magnetic spacer between the reference and free layers. Thus, the etch sequence may be employed during the fabrication of a MTJ in a MRAM device. Although a bottom spin valve structure is depicted in the exemplary embodiment, the present disclosure also encompasses top spin valve and dual spin valve configurations. Only one MTJ element is shown in the drawings although one skilled in the art will appreciate that a plurality of MTJ elements is formed in a typical device pattern. A process is defined as a method that includes one or more steps, and a sequence according to the present disclosure refers to two process components.

Referring to FIG. 1, a MTJ stack of layers that will eventually become a magnetoresistive sensor according to a method of the present disclosure is shown from the plane of an air bearing surface (ABS). The y-axis is perpendicular to the planes of the layers in the MTJ stack. There is a substrate 10 that in one embodiment is a bottom lead otherwise known as a bottom shield (S1) which may be a NiFe layer about 2 microns thick that is formed by a conventional method on a substructure (not shown). It should be understood that the substructure may be comprised of a wafer made of AlTiC, for example. Substrate 10 may also be a composite (not shown) having a bottom S1 shield and an upper gap layer wherein a top surface of the gap layer contacts seed layer 11.

A MTJ stack of layers is laid down on the substrate 10 and in the exemplary embodiment has a bottom spin valve configuration wherein a seed layer 11, AFM layer 12, pinned layer 13, non-magnetic spacer 14, free layer 15, and capping layer 16 are sequentially formed on the substrate. In an alternative embodiment (not shown) wherein the pinned layer is replaced by a reference layer with perpendicular magnetic anisotropy (PMA), the AFM layer may be omitted. Moreover, at least one additional layer may be included in the aforementioned MTJ stack such as a perpendicular Hk enhancing layer between the free layer and capping layer, an oxygen surfactant layer, or another magnetic or non-magnetic layer to enhance the performance of the final MTJ device. The seed layer 11 may be comprised of NiCr, Ta/Ru, Ta, Ta/NiCr, Ta/Cu, Ta/Cr or other materials typically employed to promote a smooth and uniform grain structure in overlying layers. Above the seed layer 11 is an AFM layer 12 used to pin the magnetization direction of the overlying pinned layer 13, and in particular, the outer portion or AP2 layer (not shown). AFM layer 12 may have a thickness from 40 to 300 Angstroms and is preferably IrMn. Optionally, one of PtMn, NiMn, OsMn, RuMn, RhMn, PdMn, RuRhMn, or MnPtPd may be employed as the AFM layer.

The pinned layer 13 preferably has a synthetic anti-parallel (SyAP) configuration represented by AP2/Ru/AP1 where a coupling layer made of Ru, Rh, or Ir, for example, is sandwiched between an AP2 layer and an AP1 layer (not shown). The AP2 layer which is also referred to as the outer pinned layer is formed on the AFM layer 12 and may be made of CoFe with a thickness of about 10 to 50 Angstroms. The magnetic moment of the AP2 layer is pinned in a direction anti-parallel to the magnetic moment of the AP1 layer. For example, the AP2 layer may have a magnetic moment oriented along the "+x" direction while the AP1 layer has a magnetic moment in the "−x" direction. A slight difference in thickness between the AP2 and AP1 layers produces a small net magnetic moment for the pinned layer 13 along the easy axis direction of the TMR sensor to be patterned in a later step. The AP1 layer may be comprised of CoFe, CoFeB, Co, or a combination thereof.

Above the pinned layer 13 is a non-magnetic spacer. In one embodiment, the non-magnetic spacer 14 may be comprised of Cu or another metal to give a MTJ stack with a GMR configuration. In another aspect, the non-magnetic spacer may have a current confining path (CCP) configuration in which a dielectric material such as a metal oxide is sandwiched between two metal layers and has metal pathways therein to restrict the current flowing between a first metal layer and second metal layer in a direction perpendicular to the planes of the metal layers. Alternatively, the non-magnetic spacer 14 may be comprised of a dielectric material such as MgO, TiOx, AlTiO, MgZnO, $Al_2O_3$, ZnO, ZrOx, HfOx, or other oxides which results in a TMR configuration. In a TMR embodiment, a MgO layer is preferably formed by depositing a first Mg layer on the pinned layer 13 and then oxidizing the Mg layer with a natural oxidation (NOX) or ROX process. Thereafter, a second Mg layer is deposited on the oxidized first Mg layer. Following a subsequent annealing step, the non-magnetic spacer essentially becomes a uniform MgO tunnel barrier layer as oxygen from the oxidized Mg layer diffuses into the second Mg layer.

The free layer 15 formed on the non-magnetic spacer 14 may be made of CoFe, CoFeB, NiFe, or a combination thereof. Optionally, other ferromagnetic materials may be selected as a single component free layer or in a composite with one or more of CoFe, CoFeB, and NiFe. In another embodiment, the free layer has a FL1/NCC/FL2 configuration where FL1 and FL2 are ferromagnetic layers, and NCC is a nanocurrent channel layer with conducting grains formed in an insulator matrix. For example, a FeSiO "NCC" layer has FeSi grains formed in a silicon oxide matrix. In yet another embodiment, the free layer may have a FL1/M/FL2 configuration where M is a non-magnetic metal such as Ta or Mg formed between two ferromagnetic layers. The free layer may have in-plane magnetization or perpendicular magnetic anisotropy.

The capping layer 16 is employed as the uppermost layer in the MTJ stack and is comprised of Ta, Ru/Ta, or Ru/Ta/Ru, for example. All layers in the MTJ stack may be deposited in a DC sputtering chamber of a sputtering system such as an Anelva C-7100 sputter deposition system which includes ultra high vacuum DC magnetron sputter chambers with multiple targets and at least one oxidation chamber. Typically, the sputter deposition process involves an argon sputter gas and a base pressure between $5\times10^{-8}$ and $5\times10^{-9}$ torr. A lower pressure enables more uniform films to be deposited. The present disclosure also anticipates that the capping layer 16 may include one or more hard mask materials such as MnPt that have specific etch rates during IBE, RIE, and chemical mechanical polish (CMP) processes to optimize the MTJ stack profile and improve resistance to erosion.

Once all of the layers 11-16 in the MTJ stack are laid down, the MTJ stack may be annealed by heating to a temperature between about 250° C. to 350° C. for a period of 2 to 10 hours while a magnetic field is applied along a certain direction to set the magnetic direction for the pinned layer and free layer. For example, if the easy axis direction is intended to be along the x-axis direction, a magnetic field may be applied along the x-axis during the annealing step. If one or both of the pinned layer and free layer have PMA character, then the anneal step may include only heating and no magnetic field.

As a first step in the MTJ patterning process, a photoresist layer 17 is coated on the top surface 16s of the capping layer 16 and is patterned to form a pattern with a plurality of parallel lines from a top view (not shown) that have a CD along an x-axis direction. Thus, the lengthwise dimension of the photoresist lines is parallel to the z-axis and the widthwise dimension is parallel to the x-axis. The width of a photoresist line (stripe) from a top view following the patterning step is referred to as the photo CD and is usually measured by a CD-scanning electron microscope (SEM). The pattern is then transferred through the MTJ stack of layers with an ion beam etch (IBE) sequence.

A key feature of the present disclosure is a two part IBE etch sequence that is employed to transfer a photoresist pattern through the MTJ stack of layers to form a critical dimension that is the free layer width (FLW) along a widthwise direction in a partially formed MTJ element with a linear shape. The etch sequence enables a FLW to be formed that is as much as 30 nm less than the photoresist pattern CD. Furthermore, the two part etch sequence is performed in such a manner that the magnetic properties including coercivity (Hc), MR ratio (dR/R), and RA (resistance×area) in the MTJ stack in FIG. 1 are substantially maintained in the patterned MTJ element. According to the two part etch sequence described herein, all etch processes are preferably performed in the same chamber of an IBE tool to optimize throughput.

Referring again to FIG. 1, a first etch process is performed with a plurality of ions 20 that have a low energy of less than 300 eV and are directed at top surface 16s with an incident angle α of 0 degrees to 40 degrees with respect to a plane A-A or B-B, for example, that is perpendicular to the substrate 10. It should be understood that FIG. 1 represents a very early stage in the first etch process. As time progresses beyond t=0, the ions are directed at sidewalls of the etched MTJ stack as well as at the uppermost surface on the remaining stack of layers to be removed. The first etch process stops on the surface of substrate 10. The substrate and MTJ pattern are rotated in a constant clockwise or counterclockwise direction around a point that is essentially the center of the substrate. Ions 20 have a primary component that is perpendicular with respect to the substrate and to MTJ element top surface 16s.

Figure 2:
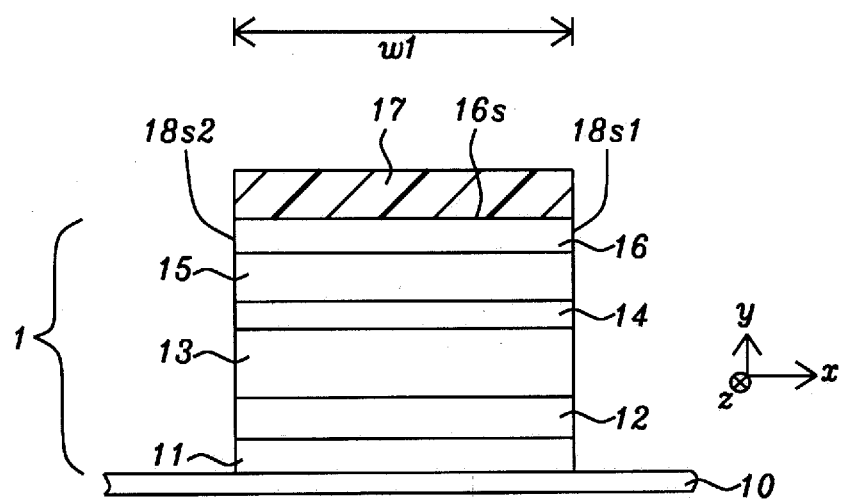
FIG. 2 is a cross-sectional view of a MTJ element with sidewalls and a free layer having a first width that are formed as a result of the first etch process depicted in FIG. 1.

Referring to FIG. 2, the low incident angle etch illustrated in FIG. 1 is employed to etch from 70% to 100% of the total MTJ volume to be removed during the entire etch sequence. In other words, the free layer has a first width shown as w1 following the first IBE process that is equal to or greater than the FLW formed at the conclusion of the etch sequence. Furthermore, the first etch process may involve a plurality of steps (≥2) in which each step comprises a different incident angle. For example, there may be a first step with a first low incident angle, a second step with a second low incident angle that is greater or less than the first low incident angle, and so forth up to an nth step with an nth low incident angle wherein at least two of the steps have different low incident angles. However, all of the steps in the first etch process preferably have low incident angles of <40 degrees with respect to a plane perpendicular to the substrate.

Figure 4:
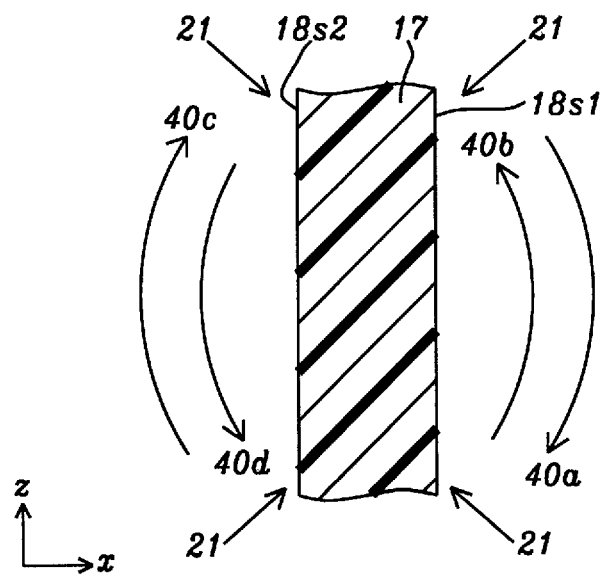
FIG. 4 is a top view that shows a sweeping motion along two sides of a partially formed linear MTJ element during the two steps of the second etch process.

As a result of the first etch process, a sidewall 18s1 is formed along one side of the MTJ stack of layers 1 and a second sidewall 18s2 is formed along the opposite side of each partially formed MTJ stack that has a line shape from a top view (FIG. 4). Only one MTJ line is shown in order to simplify the drawings. In a preferred embodiment shown in FIG. 2, the sidewalls are essentially vertical (perpendicular to the substrate 10). Note that the first IBE process may also reduce the CD of the photoresist mask layer 17 to w1 along the x-axis direction. However, the present disclosure also anticipates that the sidewalls 18s1, 18s2 may have a slope wherein the width of the capping layer 16 is less than the width of the seed layer 11 along the x-axis direction. A plurality of low incident angle steps may be advantageously used to modify the slope of sidewalls 18s1, 18s2.

The FLW of free layer 15 is a critical dimension that controls the performance of the sensor. In general, a smaller FLW will enable a higher recording density in the sensor device. In an embodiment wherein the first etch process removes essentially all of the MTJ volume to be etched in the entire sequence, and the sidewalls 18s1 and 18s2 are essentially vertical with respect to substrate 10, FLW is considered to be equal to the distance w1. On the other hand, the sidewalls may be sloped such that the width of the top surface of capping layer 16 along the x-axis direction is less than the width of the seed layer 11 at the ABS. Then, trimming may selectively occur along a bottom portion of the MTJ element by adjusting the incident angle in the subsequent second etch process to produce more vertical sidewalls 18s1, 18s2. Preferably, the ions 20 are generated from an inert gas such as Ar, Ne, or Xe with conditions comprising a flow rate of 10 to 50 standard cubic centimeters per minute (sccm), an ion current between 100 and 600 mA, and a RF power from about 100 to 600 Watts. A certain amount of residue may be redeposited on the sidewalls during the first etch process.

Figure 3:
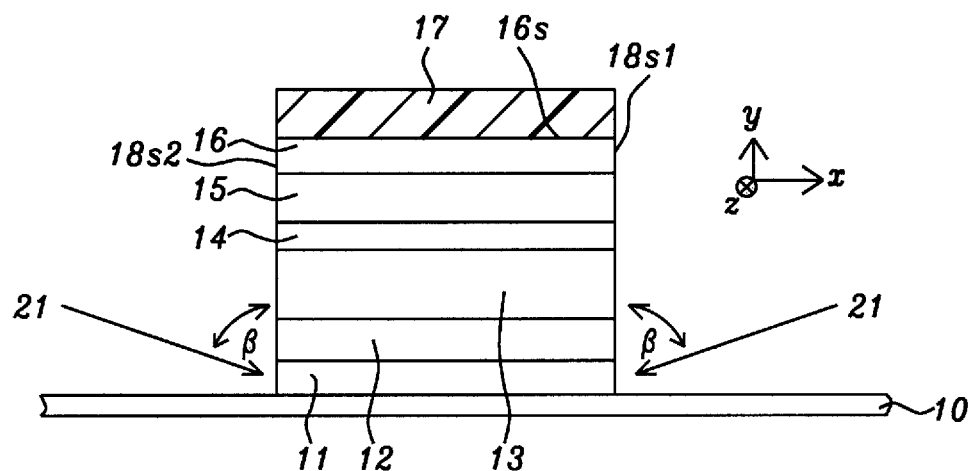
FIG. 3 is cross-sectional view of a second etch process of the present disclosure that involves directing ions at low energy and with high incident angle toward the MTJ sidewalls formed from the first etch process.

Referring to FIG. 3, a second etch process is performed with incident ions 21 that are generated with an inert gas and a low energy of less than about 300 eV. The second etch process comprises at least two steps including one step that directs ion beams at sidewall 18s1, and a second step following the first step that directs ions at sidewall 18s2. It is important that the ions 21 impinge on the sidewalls at a high incident angle β of between 60 and 90 degrees with respect to a plane that is perpendicular to substrate 10 and to MTJ element top surface 16s. In the exemplary embodiment, sidewalls 18s1, 18s2 are essentially vertical and angle β is shown with respect to the MTJ sidewalls. Ions 21 are said to have a primary component that is parallel with respect to the substrate. A second critical factor is the ions 21 are directed at the sidewall 18s1 (and later at sidewall 18s2) with a sweeping motion to further trim the free layer 15 to a width w2, and/or to further adjust the slope of the sidewalls, preferably to a more vertical slope. In embodiments where w1>FLW, the second etch process is especially beneficial in trimming the sidewalls such that w2=FLW.

The high incident angle β is necessary for efficient side trimming of the partially formed MTJ stack. Each of the steps in second IBE process may comprise two or more different high incident angles. For example, during a first portion of the etch treatment of sidewall 18s1 (or 18s2), a first high incident angle for ions 21 may be employed. Then, during a second portion of the first or second step of the second etch process, a second high incident angle may be used. All steps in the second etch process are performed with a high incident angle between 60 and 90 degrees. In all embodiments, the magnetoresistive sensor (patterned MTJ stack) has a final FLW of w2 after the second etch process in the etch sequence is completed.

Referring to FIG. 4, a top-down view of the partially formed magnetoresistive sensor is shown to illustrate the sweeping motion of the ions 21 during the steps in the second etch process. In the exemplary embodiment, the photoresist mask layer 17 (and underlying MTJ stack) has a line shape. The second etch process has a first step that comprises rotating the ions 21 from a starting position in a clockwise direction 40a for up to 90 degrees in an arc and then reversing the movement in a counterclockwise direction 40b over the same arc back to the starting position while the ions are directed only at sidewall 18s1. Optionally, the first movement from a starting position may be a counterclockwise rotation 40b followed by a clockwise motion 40a back to the starting position. The sweeping motion that includes movement 40a followed by movement 40b, or vice versa, is preferably repeated a plurality of times and occurs in the (x, z) plane. As mentioned previously, movements 40a, 40b may be performed at more than one high incident angle.

During the second step of the second etch process, the ions 21 are directed only at sidewall 18s2 and the step comprises a movement 40c in a clockwise direction over an arc up to 90 degrees followed by a movement 40d in a counterclockwise direction over the same arc back to a starting position to complete a cycle. The cycle may be repeated one or more times during the second step. Alternatively, each cycle may involve a movement 40d from a starting position followed by a movement 40c back to the starting position. Furthermore, when a plurality of cycles is employed, the ions 21 may be directed at sidewall 18s2 at more than one high incident angle. Thus, the present disclosure encompasses an embodiment wherein a first high incident angle is applied during a first cycle in the first and second steps, and a second high incident angle unequal to the first high incident angle is applied during a second cycle in the first and second steps. In an embodiment where there is a plurality of high incident angles applied in the second IBE process, there may be a different number of sweep cycles at each high incident angle. Note that the first step does not overlap the second step which means the first and second sidewalls are trimmed during different time intervals in the second etch process.

Figure 5:
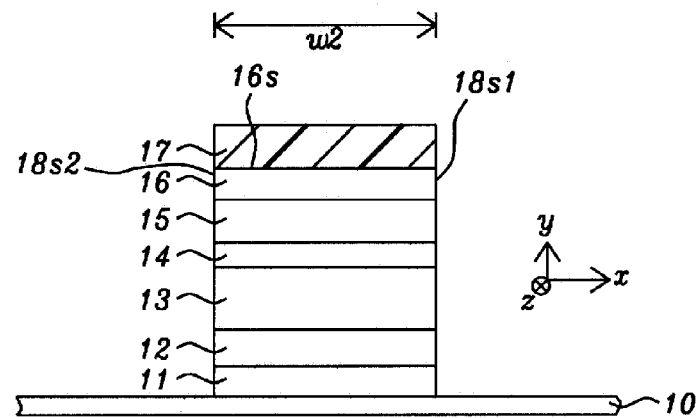
FIG. 5 is a cross-sectional view of the MTJ element following the second etch process in FIGS. 3 and 4 that shows a second free layer width (FLW) that is less than or equal to the first width.

Referring to FIG. 5, the advantage of the etch sequence described herein is that a FLW (w2) can be reproducibly formed with a value in the range of 20 to 25 nm which is substantially less than achieved by current IBE or RIE trim methods. In the three step IBE trim sequence disclosed in related patent application Ser. No. 12/658,662, the smallest FLW values that are reproducibly generated are in the range of 30 to 35 nm. Thus, we have discovered an improved method that enables sensor technology to move to critical dimensions approaching 20 nm that will be required for realizing enhanced device performance.

The slope of sidewalls 18s1, 18s2 may be manipulated to an angle that varies from 90 degrees with respect to substrate 10 to an angle less than 90 degrees where the width of capping layer 16 is less than the width of seed layer 11 along the ABS. When a plurality of low incident angles and/or a plurality of high incident angles are used in the first and second etch processes, respectively, there is more flexibility in tuning the sidewall slope. In certain sensor designs, the sidewall slope is less than 90 degrees to avoid a tendency for MTJ stacks with a high aspect ratio (height/width) to collapse during ion milling. The slope of sidewalls 18s1, 18s2 may be modified by changing the incident angle of one or both of the etch processes. In particular, the first and second etch processes may be optimized to generate a sidewall slope that is more vertical with respect to substrate 10.

Figure 6:
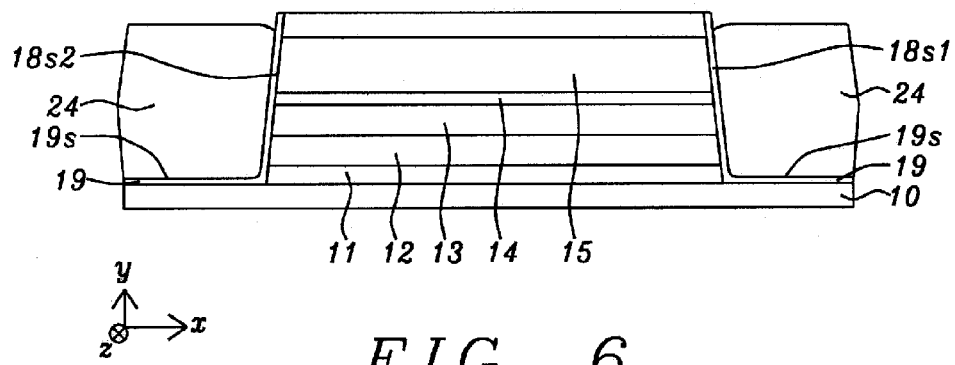
FIG. 6 is a cross-section view of the sensor structure in FIG. 5 after an insulation layer and hard bias layer are sequentially formed along sidewalls of the partially formed MTJ element, and removal of the first photoresist mask layer.

Referring to FIG. 6, fabrication of a MTJ element following the completion of previously described two part etch sequence related to magnetoresistive sensor (MTJ) 1 comprises additional steps. In one embodiment, an insulation layer 19 is formed along the sidewalls 18s1, 18s2 and on a top surface of exposed portions of the substrate 10. Next, a hard bias or shielding layer 24 for providing longitudinal bias to the free layer is typically formed on the insulation layer and proximate to the sidewalls of the MTJ element. The first photoresist layer is then removed.

Figure 7:
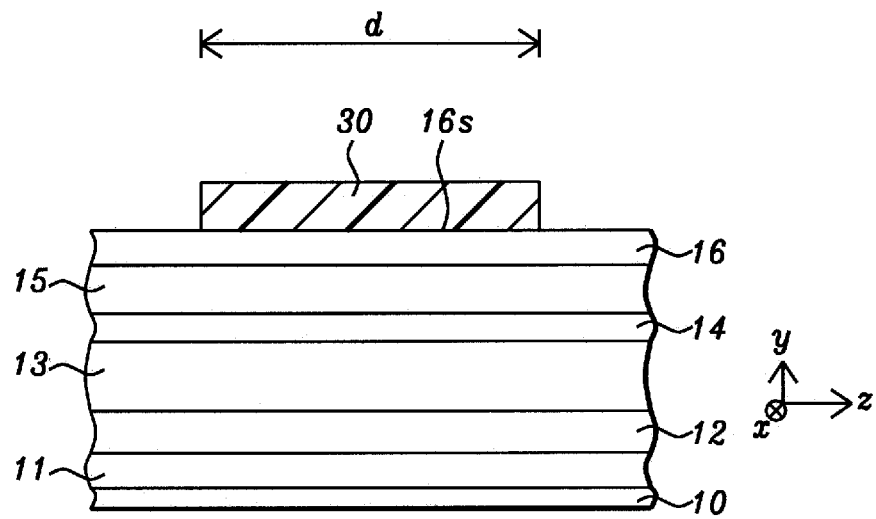
FIG. 7 is a cross-sectional view of the sensor structure in FIG. 6 from a plane perpendicular to the ABS that shows a second photoresist pattern formed on a top surface of the partially formed MTJ element.

Referring to FIG. 7, a subsequent step involves coating a second photoresist layer 30 on top surface 16s and patterning the photoresist layer to form a plurality of lines with a lengthwise dimension along the x-axis direction and having a critical dimension or width d along a z-axis direction. The resulting photoresist pattern serves as an etch mask in the following step. Only one photoresist mask line is shown to simplify the drawing. However, there are a plurality of second photoresist lines that are formed perpendicular to the linear shaped MTJ lines formed by the etch sequence of the present disclosure. A third IBE etch process is employed to transfer the photoresist pattern through the partially formed MTJ element and thereby form a plurality of MTJ island shapes. The third etch process uncovers portions of the substrate between the island shapes to form openings that are subsequently filled with an insulation layer (not shown). The insulation layer 31 (FIG. 8) may cover the previously deposited hard bias layers. Then, the insulation layer is planarized by a chemical mechanical polish (CMP) process to form a top surface that is coplanar with a top surface of the MTJ islands also referred to as MTJ nanopillars in the art.

Figure 8:
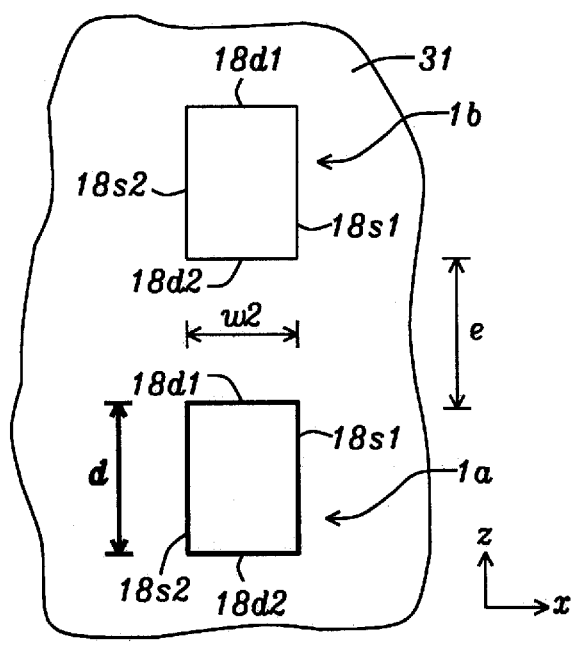
FIG. 8 is a top-down view of two MTJ elements following a third etch process that transfers the photoresist pattern in FIG. 7 through the MTJ stack to define a second dimension and sidewalls along a second direction that is perpendicular to the first dimension and sidewalls formed by the etch sequence in FIGS. 1-4.

Referring to FIG. 8, the plurality of island shapes formed by the third etch process are depicted from a top view with the second photoresist pattern removed. In the exemplary embodiment, the shapes have a rectangular shape although in other embodiments they may be elliptical, or circular, for example. Only two MTJ elements 1a, 1b are illustrated. However, one skilled in the art appreciates that an array with multiple rows and columns comprising a plurality of MTJ elements are formed after the third etch process. Thus, the first and second sidewalls 18s1, 18s2 resulting from the etch sequence of the present disclosure become part of a continuous sidewall around the plurality of MTJ elements. Preferably, FLW=w2 is retained along an x-axis direction for each MTJ element. A sidewall 18d1 and sidewall 18d2 are formed perpendicular to sidewalls 18s1, 18s2 and define a second critical dimension d along the z-axis direction for each MTJ element. The aforementioned sidewalls form a continuous sidewall around each MTJ element. Note that the second photoresist pattern not only determines the second critical dimension d but also the z-axis spacing e between the MTJ elements including 1a, 1b. Preferably d is greater than FLW (w2). According to the exemplary embodiment, an insulation layer 31 surrounds the MTJ elements.

Figure 9:
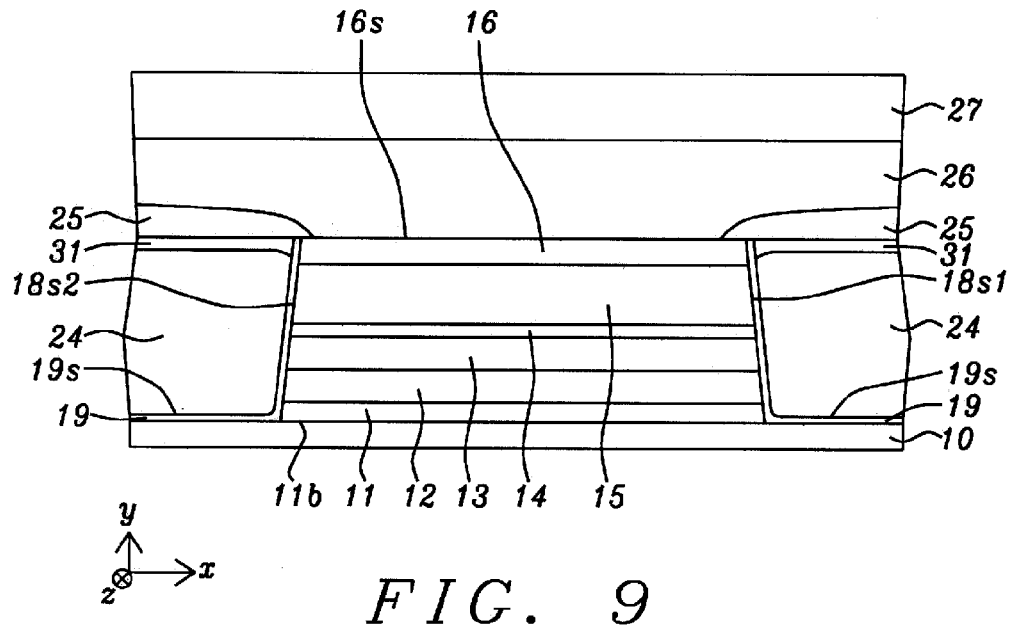
FIG. 9 is a cross-sectional view from the ABS of the sensor structure in FIG. 8 after leads and a top shield are formed on the array of MTJ elements according to an embodiment of the present disclosure.

Referring to FIG. 9, a read head sensor structure is shown from an ABS view according to one embodiment wherein electrical leads 25 are formed on insulation layer 31 above hard bias layer 24. A conventional process is employed to sequentially form a second gap layer 26 and second shield (S2) 27 on the top surface 16s of capping layer 16. In this embodiment, sidewalls 18s1, 18s2 are depicted with a slope unequal to 90 degrees that is sometimes preferred to prevent MTJ collapse during a subsequent ion milling step. Therefore, a width of the top surface 16s in an x-axis direction is less than the width of a bottom surface 11b where layer 11 interfaces with the substrate. In an alternative embodiment (not shown), the sidewalls may have a vertical slope with respect to substrate 10 in order to enable a maximum density in the MTJ array formed on the substrate. It should be understood that the present disclosure encompasses other hard bias configurations and is not limited to the embodiment depicted in FIG. 7 and FIG. 9.

EXAMPLE 1

In order to demonstrate the benefits of the two step IBE process sequence of the present disclosure, a TMR sensor was fabricated according to a method previously practiced by the inventors, and according to an embodiment as described herein. For each wafer 1 and 2, a sensor with a bottom spin valve configuration was formed on a AlTiC substrate and is represented by Ru/Ta/IrMn/CoFe/Ru/CoFeB/MgO/CoFeB/Ru/Ta where Ru/Ta is the seed layer, IrMn is the AFM layer, CoFe/Ru/CoFeB is the pinned layer, MgO is a tunnel barrier layer, CoFeB is the free layer, and Ru/Ta is a composite capping layer.

Wafer 1 represents a sensor sample made according to an embodiment of the present disclosure wherein the first etch process with a low incident angle of 8 degrees removes 100% of the MTJ stack to be etched away during the entire etch sequence. Then a second etch process is performed and comprises a sweeping motion at a high incident angle of 70 degrees as described previously. Wafer 2 is a reference sample that is a sensor made by a method described in related patent application Ser. No. 12/658,662 in which the partially formed MTJ element is made by a three step IBE sequence. The first IBE step involves an incident angle of 8 degrees with respect to a plane formed perpendicular to the substrate and removes 80% of the total MTJ film stack. Thereafter, a second IBE step comprises a sweeping motion at a high incident angle of 70 degrees followed by a third IBE step at a low incident angle of 8 degrees to remove the final 20% of the MTJ film stack and form a FLW. As shown in Table 1, the sensors built on wafers 1 and 2 both achieve a RA=1.0 ohm-μm² and a dR/R=62% and 63%, respectively.

Figure 10:
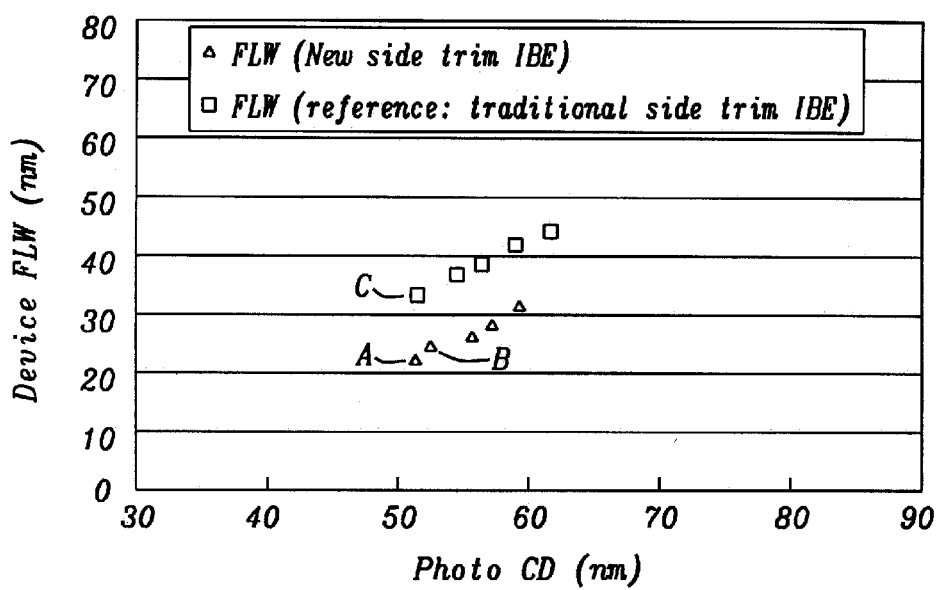
FIG. 10 is a graph that depicts the relationship between the CD in a photoresist mask pattern and the free layer width (FLW) in the MTJ element following transfer of the photoresist mask pattern through a MTJ stack of layers with a two part etch sequence according to a method of the present disclosure.

Referring to FIG. 10, CD measurements obtained from wafers processed with the two part etch sequence of the present disclosure are represented by the triangle shapes. The data indicates, for example, when photoresist CD=52 nm (point A) after the photoresist pattern formation, the final FLW value achieved is about 22 nm for a reduction of 30 nm when the two part etch sequence of the present disclosure is employed. Similarly, a 53 nm photoresist CD is reduced to about 24 nm (point B) following a two part etch sequence as described herein. For the reference sample, an initial photoresist CD of 53 nm was reduced to 34 nm (point C) following the previously practiced three step IBE trim method. Photoresist CD measurements were obtained using a CD-SEM and FLW measurements are taken from transmission electron microscopy (TEM) cross-sections.

TABLE 1

Effect of IBE conditions on magnetic properties of NiCr/IrMn/CoFe/Ru/CoFeB/MgO/CoFeB/Ru/Ta/Ru TMR sensors

| Wafer | IBE Condition | RA | dR/R | Normalized dR/R | CD-FLW (nm) |
|---|---|---|---|---|---|
| 1 | 8 deg. angle etch with 100% MTJ stack removal + 2nd etch with | 1.0 | 62% | 0.98 | 29 |

TABLE 1-continued

Effect of IBE conditions on magnetic properties of
NiCr/IrMn/CoFe/Ru/CoFeB/MgO/CoFeB/Ru/Ta/Ru TMR sensors

| Wafer | IBE Condition | RA | dR/R | Normalized dR/R | CD-FLW (nm) |
|---|---|---|---|---|---|
| 2 | 70 deg. sweep 8 deg. angle with 80% MTJ stack removal + 70 degree sweep + 8 degree angle etch with final 20% MTJ stack removal | 1.0 | 63% | 1.00 | 19 |

In summary, a critical dimension reduction (photoresist CD-FLW) of about 30 nm from an initial photoresist CD in the range of 50 nm to 70 nm can be achieved by following a two part IBE sequence of the present disclosure while the maximum CD reduction realized by a previously practiced three step method is only 19 nm. With regard to Wafer 1, the time required for the first etch process is typically between 130 and 150 seconds and the time period for the second etch process involving the 70 degree sweep of both sidewalls is from 30 to 60 seconds.

The two part etch sequence as disclosed herein may be readily implemented in existing manufacturing lines since no new tools or materials are required. Furthermore, the process can be applied to sensor devices of older technology products where there is evidence of damage from a prior art two step IBE process thereby improving magnetic properties of CIP-GMR, CPP-GMR, and TMR sensors where CIP refers to current-in-plane and CPP means current perpendicular to plane.

While this disclosure has been particularly shown and described with reference to, the preferred embodiment thereof, it will be understood by those skilled in the art that various changes in form and details may be made without departing from the spirit and scope of this disclosure.

We claim:

1. A method of reducing a critical dimension (CD) in a photoresist mask layer to a free layer width (FLW) in an underlying magnetic tunnel junction (MTJ) stack of layers, comprising:
   (a) providing a MTJ stack of layers on a substrate including a pinned layer, a free layer, and a non-magnetic spacer between the pinned layer and free layer;
   (b) coating a photoresist layer on a top surface of the MTJ stack and patterning the photoresist layer to form a parallel line pattern wherein each line has a first critical dimension (CD) that is a width along a first axis that is perpendicular to a lengthwise dimension of the lines in a second axis direction, a second MTJ critical dimension that is along the second axis direction is determined in a separate photoresist coating and etching sequence;
   (c) performing a first ion beam etch (IBE) process with ions having one or more incident angles less than about 40° with respect to a plane that is perpendicular to the substrate to transfer the line pattern in the photoresist layer through the MTJ stack of layers and thereby generate a plurality of lines in the MTJ stack such that each line has a top surface and first and second sidewalls wherein the sidewalls connect the top surface with the substrate, and the free layer in each line has a first width between the first and second sidewalls and along a plane that is parallel to the MTJ top surface; and
   (d) performing a second IBE process with a sweeping motion and with ions having one or more incident angles greater than about 60° with respect to a plane that is perpendicular to the substrate such that the free layer has a second width which is the FLW that is less than or equal to the first width, the second IBE process includes a first step wherein ions are directed with the sweeping motion comprising a counterclockwise movement and a clockwise movement only at the first sidewall, and includes a second step wherein ions are directed with the sweeping motion comprising a clockwise movement and a counterclockwise movement only towards the second sidewall, the first and second steps do not overlap so that the first and second sidewalls are trimmed during different time intervals.

2. The method of claim 1 wherein the first and second IBE processes comprise an inert gas and an energy less than about 300 eV.

3. The method of claim 2 wherein the first and second IBE processes comprise an ion current between about 100 and 600 mA and a RF power from about 100 to 600 Watts.

4. The method of claim 1 wherein the sweeping motion in the second IBE process comprises a first movement of rotating the substrate within an arc of up to about 90 degrees in a clockwise or counterclockwise direction from a starting position followed by a second movement of rotating the substrate in the opposite direction back to the starting position to complete a cycle, the first and second movements are repeated a plurality of times to result in a plurality of cycles.

5. The method of claim 1 wherein the first IBE process is responsible for removing about 70% to 100% of the MTJ stack that is etched to form the plurality of MTJ lines.

6. The method of claim 4 wherein the sweeping motion is performed at a first high incident angle during at least a first cycle of the first and second steps, and the sweeping motion is performed at a second high incident angle different from the first high incident angle during at least a second cycle of the first and second steps.

7. The method of claim 1 wherein the photoresist layer CD is from about 50 to 70 nm and the free layer has a FLW about 30 nm less than the photoresist layer CD.

8. The method of claim 1 wherein the MTJ stack of layers is used to form a CIP-GMR, CPP-GMR, or a TMR sensor.

9. The method of claim 1 wherein the first and second sidewalls have an angle (slope) with respect to the substrate that may be adjusted by using a plurality of low incident angles during the first IBE process and by employing more than one high incident angle during the second IBE process.

10. The method of claim 6 wherein a number of cycles applied at a first high incident angle is unequal to a number of cycles applied at a second high incident angle during each of the first and second steps.

11. A method of fabricating a magnetoresistive sensor element with a free layer having a width (FLW) that is less than a first critical dimension (CD) formed in a photoresist layer during a photolithography process that defines a shape of the sensor element, comprising:
   (a) providing a magnetic tunnel junction (MTJ) stack of layers on a substrate including a pinned layer, free layer, and a non-magnetic spacer between the pinned layer and free layer;
   (b) coating a first photoresist layer on a top surface of the MTJ stack and patterning the first photoresist layer to form a first line shape and having a first critical dimension (CD) that is a width along a first axis that is perpendicular to a lengthwise dimension of the first line shape;
   (c) performing a first ion beam etch (IBE) process with ions having one or more incident angles less than about 40° with respect to a plane that is perpendicular to the substrate to transfer the line shape in the first photoresist layer through the MTJ stack and thereby generate first and second sidewalls wherein each sidewall connects a top surface of the MTJ stack with the substrate, the free layer has a first width between the first and second sidewalls and along a plane that is parallel to the MTJ top surface;

(d) performing a second IBE process with a sweeping motion and with ions having one or more incident angles greater than about 60° with respect to a plane that is perpendicular to the substrate such that the free layer has a second width between the two sidewalls that is the FLW, and is less than or equal to the first width, the second IBE process includes a first step wherein ions are directed with the sweeping motion comprising a clockwise movement and a counterclockwise movement only at the first sidewall, and includes a second step wherein ions are directed with the sweeping motion comprising a clockwise movement and a counterclockwise movement only towards the second sidewall, the first and second steps do not overlap so that the first and second sidewalls are trimmed during different time intervals;

(e) removing the first photoresist layer and then coating and patterning a second photoresist layer on the top surface of the MTJ stack to form a second line shape in the second photoresist layer that has a second critical dimension along a second axis that is perpendicular to the first axis; and (f) transferring the second line shape through the MTJ stack with an etch process to form a plurality of MTJ nanopillars each having a FLW along the first axis direction and a second critical dimension along the second axis direction.

12. The method of claim 11 wherein the first and second IBE processes comprise an inert gas and an energy less than about 300 eV.

13. The method of claim 12 wherein the first and second IBE processes comprise an ion current between about 100 and 600 mA and a RF power from about 100 to 600 Watts.

14. The method of claim 11 wherein the sweeping motion in the second IBE process comprises a first movement of rotating the substrate within an arc of up to about 80 degrees in a clockwise or counterclockwise direction from a starting position followed by a second movement of rotating the substrate in the opposite direction back to the starting position to complete a cycle, the first and second movements are repeated a plurality of times to result in a plurality of cycles.

15. The method of claim 11 wherein the first IBE process is responsible for removing about 70% to 100% of the MTJ stack this is etched to form the first line shape.

16. The method of claim 14 wherein the sweeping motion is performed at a first high incident angle during at least a first cycle of the first and second steps, and the sweeping motion is performed at a second high incident angle different from the first high incident angle during at least a second cycle of the first and second steps.

17. The method of claim 11 wherein the first and second sidewalls have an angle (slope) with respect to the substrate that may be adjusted by using a plurality of low incident angles during the first IBE process and by employing more than one high incident angle during the second IBE process.

18. The method of claim 11 wherein the first critical dimension in the first line shape is from about 50 to 70 nm and the free layer has a FLW that is about 30 nm less than the first critical dimension.

19. The method of claim 11 wherein the second critical dimension is greater than the FLW.

20. The method of claim 11 wherein the first and second sidewalls have a slope that is essentially perpendicular to the substrate, or are sloped such that a width in the first axis direction along a top surface of the MTJ element is less than a width in the first axis direction along a bottom surface.

* * * * *